United States Patent
Gaines et al.

(10) Patent No.: US 7,851,325 B1
(45) Date of Patent: Dec. 14, 2010

(54) STRAINED SEMICONDUCTOR USING ELASTIC EDGE RELAXATION, A BURIED STRESSOR LAYER AND A SACRIFICIAL STRESSOR LAYER

(75) Inventors: R. Stockton Gaines, Pacific Palisades, CA (US); Daniel J. Connelly, San Francisco, CA (US); Paul A. Clifton, Mountain View, CA (US)

(73) Assignee: Acorn Technologies, Inc., Santa Monica, CA (US)

( * ) Notice: Subject to any disclaimer, the term of this patent is extended or adjusted under 35 U.S.C. 154(b) by 4 days.

(21) Appl. No.: 12/209,957

(22) Filed: Sep. 12, 2008

(51) Int. Cl.
*H01L 21/20* (2006.01)

(52) U.S. Cl. .................. 438/424; 438/479; 438/517; 438/149; 257/E27.147

(58) Field of Classification Search .......... 438/424, 438/149, 478–480, 517; 257/E27.147
See application file for complete search history.

(56) References Cited

U.S. PATENT DOCUMENTS

| | | | |
|---|---|---|---|
| 4,994,866 | A | 2/1991 | Awano |
| 5,734,598 | A | 3/1998 | Abott et al. |
| 6,175,588 | B1 | 1/2001 | Viscotsky et al. |
| 6,406,973 | B1 | 6/2002 | Lee |
| 6,492,216 | B1 | 12/2002 | Yeo et al. |
| 6,498,359 | B2 | 12/2002 | Schmidt et al. |
| 6,600,170 | B1 | 7/2003 | Xiang |
| 6,881,635 | B1 | 4/2005 | Chidambarrao et al. |
| 6,927,138 | B2 * | 8/2005 | Takenaka ............ 438/294 |
| 7,019,326 | B2 | 3/2006 | Cea et al. |
| 7,138,310 | B2 | 11/2006 | Currie et al. |
| 2002/0065664 | A1 | 5/2002 | Witzgall et al. |
| 2002/0136277 | A1 | 9/2002 | Reed et al. |
| 2002/0152253 | A1 | 10/2002 | Ricks et al. |
| 2002/0191568 | A1 | 12/2002 | Ghosh |
| 2003/0227886 | A1 | 12/2003 | Abrishamkar et al. |
| 2004/0021179 | A1 | 2/2004 | Lee et al. |
| 2005/0093021 | A1 | 5/2005 | Ouyang et al. |

(Continued)

FOREIGN PATENT DOCUMENTS

EP  1 231 643 A2  8/2002

(Continued)

OTHER PUBLICATIONS

J. S. Goldstein, I. S. Reed and L. L. Schart, A Multistage Representation of the Wiener filter Based on Orthogonal Projections, IEEE Transactions on Information Theory, vol. 44, No. 7, Nov. 1998.

(Continued)

*Primary Examiner*—Thanh Nguyen
(74) *Attorney, Agent, or Firm*—Orrick, Herrington & Sutcliffe, LLP

(57) ABSTRACT

The present invention relates to creating an active layer of strained semiconductor using a combination of buried and sacrificial stressors. That is, a process can strain an active semiconductor layer by transferring strain from a stressor layer buried below the active semiconductor layer and by transferring strain from a sacrificial stressor layer formed above the active semiconductor layer. As an example, the substrate may be silicon, the buried stressor layer may be silicon germanium, the active semiconductor layer may be silicon and the sacrificial stressor layer may be silicon germanium. Elastic edge relaxation is preferably used to efficiently transfer strain to the active layer.

19 Claims, 6 Drawing Sheets

U.S. PATENT DOCUMENTS

| | | | |
|---|---|---|---|
| 2005/0106792 A1 | 5/2005 | Cea et al. | |
| 2005/0133817 A1 | 6/2005 | Huang et al. | |
| 2008/0265299 A1* | 10/2008 | Bulsara et al. | 257/301 |

FOREIGN PATENT DOCUMENTS

| | | |
|---|---|---|
| EP | 1 231 643 A3 | 10/2004 |
| WO | WO 00/67389 A | 11/2000 |
| WO | WO 03/085830 A | 10/2003 |

OTHER PUBLICATIONS

M. L. Honig and J. S. Goldstein, "Adaptive Reduced-Rank Residual Correlation Algorithms for DS-CDMA Interference Suppression," In Proc. 32th Asilomar Conference Signals, Systems and Computer, Pacific Grove, CA, Nov. 1998.

D. C. Ricks and J. S. Goldstein, "Efficient Architectures for Implementing Adaptive Algorithms," Proceedings of the 2000 Antenna applications Symposium, Allerton Park, Monticello, IL., Sep. 20-22, 2000.

J. S. Goldstein and I. S. Reed, "Reduced-Rank Adaptive Filtering," IEEE Transactions on Signal Processing, vol. 45, No. 2, Feb. 1997.

M. L. Honig and W. Xiao, "Performance of Reduced Rank Linear Interference," work supported by U. S. Army Research office under grant DAAH04-96-I-0378, Jan. 2001.

International Search Report for PCT/US03/10180, Jul. 30, 2003.

International Search Report for PCT/US2005/025335, Aug. 2, 2006.

International Search Report/Written Opinion for PCT/US2007/006171, Sep. 28, 2007.

D. C. Ricks, P. G. Cifuentes and J. S. Goldstein, "What is Optimal Processing for Nonstationary Data?" Conference Record of the Thirty Fourth Annual Asilomar Conference on Signals, Systems and Computers, Pacific Grove California, Oct. 29-Nov. 2, 2002.

J. S. Goldstein and I. S. Reed, "Performance measures for Optimal Constrained Beamformers," IEEE Transactions on Antennas and Propagation, vol. 45, No. 1, Jan. 1997.

J. S. Goldstein, I. S. Reed, and R. N. Smith, "Low-Complexity Subspace Selection for Partial Adaptivity", Proceedings of IEE Milcom, Oct. 1996.

W. L. Myrick, M. D. Zoltowski and J. S. Goldstein, "Low-Sample Performance of Reduced-Rank Power Minimization Based Jammer Suppression for GPS," IEEE 6th International Symposium Tech. & Appli., NJIT, New Jersey, Sep. 6-8, 2000.

W. Chen, U. Mitra and P. Schniter, "Reduced Rank Detection Schemes for DS-CDMA Communication Systems," private communication, Jan. 2002.

J. Scott Goldstein, et al., "A New Method of Wiener Filtering and its Application to Interference Mitigation for Communications," IEEE, pp. 1087-1091, 1997.

Colin D. Frank, et al. "Adaptive Interference Suppression for the Downlink of a Direct Sequence CDMS System with Long Spreading Sequences," Part of work was presented at the 36th Annual Allerton Conference on Communication, Control and Computing, Monticello, Illinois, pp. 1-31, Sep. 1998.

Samina Chowdhury, et al. "Reduced-Rank Chip-level MMSE Equalization for the 3G CDMA Forward Link with Code-Multiplexed Pilot," Invited Paper for Special Issue of EURASIP Journal on Applied Signal Processing, pp. 1-27, Jul. 2001.

Belkacem Mouhouche, et al., "Chip-Level MMSE Equalization in the Forward Link of UMTS-FDD: A Low Complexity Approach," IEEE, pp. 1015-1019, 2003.

M. Joham, et al. "A New Backward Recursion for the Multi-Stage Nested Wiener Filter Employing Krylov Subspace Methods," pp. 1-4.

Michael L. Honig, "Adaptive Reduced-Rank Interference Suppression Based on the Multistage Wiener Filter," IEEE Transactions on Communications, vol. 50, No. 6, pp. 986-994, Jun. 2002.

S.C. Jain, H.E. Maes, K. Pinardi, and I. De Wolf, "Stresses and Strains in Lattice-Mismatched Stripes, Quantum Wires, Quantum Dots, and Substrates in Si Technology", American Institute of Physics. 79 (11), Jun. 1, 1996.

H. Yin, K.D. Hobart and F.J. Kub, S.R. Shieh and T.S. Duffy, J.C. Sturm, "Strain Partition of Si/SiGe and $SiO_2$/SiGe on Compliant Substrates," American Institute of Physics, Appl. Phys., Jun. 2, 2003.

A. Fisher and H. Richter, "Elastic Misfit Stress Relaxation in Heteroepitaxial SiGe/Si Mesa Structures," 1992 American Institute of Physics, Appl. Phys. Lett 61 (22), Nov. 30, 1992.

Hirohisa Kawasaki, et al., "Impact of Parasitic Resistance and Silicon Layer Thickness Scaling for Strained-Silicon MOSFETs on Relaxed $Si_{1-x}Ge_x$ Virtual Substrate,", 2004 IEEE.

Shyam Gannavaram, "Low Temperature ($\leq 800°$ C.) Recessed Junction Selective Silicon-Germanium Source/Drain Technology for Sub-70 nm CMOS," 2000 IEEE Xplore, IEDM 00-437-440.

Scott E. Thompson, et al. "A 90-nm Logic Technology Featuring Strained-Silicon," IEEE Transactions of Electron Devices, vol. 51, No. 11, Nov. 2004.

* cited by examiner

STRAINED SEMICONDUCTOR USING ELASTIC EDGE RELAXATION, A BURIED STRESSOR LAYER AND A SACRIFICIAL STRESSOR LAYER

FIELD OF THE INVENTION

The present invention relates to strained semiconductor devices that incorporate strained active layers. The invention also relates to methods of making strained semiconductor devices using a sacrificial stressor layer.

DESCRIPTION OF THE RELATED ART

Strained silicon is widely viewed as an important technology for obtaining desired advancements in integrated circuit performance. Mobility enhancement results from a combination of reduced effective carrier mass and reduced intervalley (phonon) scattering. For MOS field effect transistors (MOSFETs) fabricated on conventional {100} oriented Si substrates with conduction primarily along orthogonal <110> crystal axes, n-channel MOSFETs achieve improved performance with induced biaxial tensile stress in the top silicon layer along both the width and length axes of the active area. p-channel MOSFETs exhibit improved performance with induced uniaxial tensile stress in the top silicon layer along the width axis only (transverse tensile stress). p-channel MOSFETs also exhibit improved performance with induced uniaxial compressive stress in the top silicon layer along the length axis only (longitudinal compressive stress). Compressive stress can be provided selectively in a silicon surface layer, for example, by using recessed selective epitaxial SiGe stressors in the source and drain regions of a MOSFET to induce a desired compressive stress along the length axis (longitudinal).

Strained silicon is conventionally obtained by first growing a thick layer of silicon germanium alloy (SiGe) on a silicon substrate. The SiGe layer is grown to a sufficient thickness that the SiGe layer is relaxed to an unstrained condition at its surface. The in-plane lattice parameter of the SiGe surface is similar to that of a bulk crystal of SiGe of the same composition. SiGe alloys have larger lattice parameters than silicon. Hence the relaxed surface of the SiGe layer provides an in-plane lattice parameter larger than that of silicon. A subsequent thin layer of silicon is grown epitaxially on the relaxed surface of the SiGe layer. The thin epitaxial layer of silicon assumes the larger in-plane lattice parameter of the SiGe and grows in a strained state with bonds in the crystal lattice elongated in the growth plane. This approach, sometimes known as substrate-strained silicon or "virtual substrate" technology, grows a thin pseudomorphic layer of silicon on the relaxed surface of a SiGe layer.

So long as the strained silicon layer does not exceed a "critical thickness" for strain relaxation and some care is taken, the tensile strain is maintained in the strained silicon layer throughout the various implantation and thermal processing steps typical of CMOS manufacturing.

The use of a relaxed SiGe layer as a "virtual substrate" to strain a subsequently deposited epitaxial silicon layer inevitably requires acceptance of a very high dislocation density in the SiGe layer because the SiGe relaxation mechanism is plastic in nature. In other words, relaxation in the SiGe layer occurs through the generation of strain-relieving misfit dislocations. A SiGe layer thinner than the critical thickness on a silicon substrate is not relaxed and exhibits few misfit dislocations. If the SiGe layer is thicker than the critical thickness, the strained lattice undergoes plastic deformation and the stress is relieved by the nucleation and propagation of misfit dislocations. Some fraction of misfit dislocations give rise to threading dislocations (at least $10^4$-$10^5$ cm) which propagate through the overlying strained silicon layer. Threading dislocations represent extended defects and give rise to multiple undesirable consequences in MOSFETs including source/drain junction leakage, reduction of channel mobility, variability of threshold voltage and enhanced diffusion paths leading to potential drain-to-source shorting in short-channel MOSFETs.

SUMMARY OF THE PREFERRED EMBODIMENTS

An aspect of the present invention provides a method of manufacturing a semiconductor device, comprising providing a substrate, forming a buried stressor layer over the substrate and forming an active layer over the buried stressor layer. The buried stressor layer is between the substrate and the active layer. The buried stressor layer is formed in a stressed state in comparison to its equilibrium state. The method continues by forming a sacrificial stressor layer over the active layer, the sacrificial stressor layer formed in a stressed state in comparison to its equilibrium state. Trenches are etched through the active layer, through the buried stressor layer and into at least a portion of the substrate to provide a strained active region defined laterally on at least two sides by trench walls.

Another aspect of the invention provides a method of manufacturing a semiconductor device, comprising providing a substrate, forming a buried stressor layer over the substrate and forming an active layer over the buried stressor layer. The buried stressor layer is between the substrate and the active layer. The buried stressor layer formed in a stressed state in comparison to its equilibrium state. A sacrificial stressor layer is formed over the active layer. The sacrificial stressor layer is formed in a stressed state in comparison to its equilibrium state. The method continues by etching trenches through the sacrificial stressor layer, the active layer and through at least a portion of the buried stressor layer to provide a strained active region defined laterally on at least two sides by trench walls. The method includes filling the trenches to maintain at least a portion of transferred stress within the strained active region.

DETAILED DESCRIPTION OF THE PREFERRED EMBODIMENTS

Figure 1:
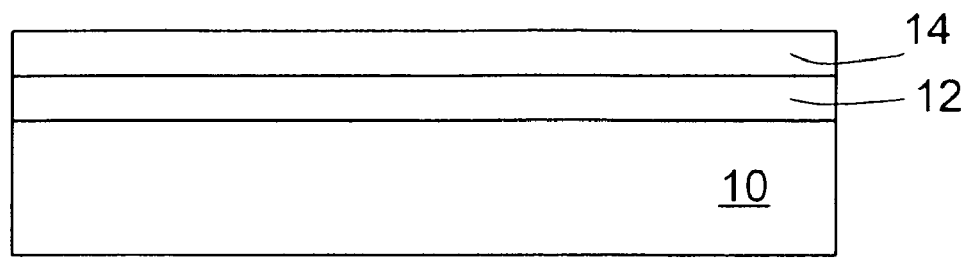
FIGS. 1-4 illustrate process steps according to aspects of the present invention for forming a strained semiconductor active region.

The present invention relates to creating an active layer of strained semiconductor using a combination of buried and sacrificial stressors. That is, a process can strain an active semiconductor layer by transferring strain from a stressor layer buried below the active semiconductor layer and by transferring strain from a sacrificial stressor layer formed above the active semiconductor layer. Processes that use both buried and sacrificial stressor layers to strain an active semiconductor layer can create a comparatively greater level of strain in the active semiconductor layer. Simulations of active semiconductor layers strained by a combination of buried and sacrificial stressor layers indicate that the combined stressors can be more effective than either a buried stressor layer or a sacrificial stressor layer used alone. The following description is provided primarily in terms of a strained silicon active layer, but the solutions and strategies described here have application to other semiconductors and semiconductor systems. In addition, the following description is made in terms of applying strain to an active semiconductor layer, but this nomenclature is used for clarity and is not intended to limit application of the described strategies to specific layers. In presently contemplated implementations, the semiconductor layer to which strain is transferred is used as at least a portion of an active layer for at least some of the devices formed by the processes described here but strain can be applied to layers other than active layers.

Preferred aspects of the present invention can provide strained semiconductor active layers and may, for example, provide a tensile strained silicon layer favorable for the fabrication of certain high performance MOSFETs. Preferably strain is applied to the desired active semiconductor layer both from a buried stressor layer and from a sacrificial stressor layer temporarily provided over the desired active layer. Considering first the buried stressor component of this strategy, a preferred process epitaxially grows an active silicon layer on top of a layer of compressively strained silicon germanium (SiGe) alloy. As deposited, the active silicon layer is not strained because the silicon germanium layer is compressively strained and not relaxed. The resulting structure may be further processed including, for example, by growing a sacrificial stressor layer on the active silicon layer.

Whether or not the process forms a sacrificial stressor layer above the active silicon layer at this point in the process, the process subsequently etches isolation trenches through the silicon and silicon germanium layers in a manner that relaxes the buried silicon germanium layer and allows transfer of at least a portion of the compressive strain from the silicon germanium layer to induce tensile strain in the active silicon layer through edge relaxation. Edge relaxation strategies are described in U.S. Pat. No. 7,338,834, which patent is incorporated by reference in its entirety for its teachings regarding edge relaxation and creating strained semiconductor layers. Edge relaxation patterns a multilayer structure so that a compressively strained stressor layer can relax and expand laterally to in turn induce strain in another layer. By selecting other combinations of materials, edge relaxation can create compress strained active layers.

Either before or after etching trenches to at least partially relax the buried stressor layer, particularly preferred processes form a sacrificial stressor layer on the active semiconductor layer. This discussion uses the term sacrificial stressor layer to identify a layer of material provided over an active semiconductor layer so that the stressor layer can be used to stress regions of the active semiconductor layer. Preferably the stressor layer is removed following transfer of at least a portion of the stress from the stressor layer to the underlying active semiconductor layer, so that the stressor layer is appropriately considered a sacrificial layer. The sacrificial stressor layer may have compressive or tensile stress as deposited, depending on the type of strain to be provided to the active semiconductor layer. Preferred implementations of the present invention use a sacrificial stressor layer to increase the strain transferred from a buried stressor layer in combination with a strategy for maintaining some portion of the strain transferred to the active semiconductor layer after the sacrificial stressor layer is removed. In the illustrated implementations, the active layer is tensile strained so it is preferred that the sacrificial stressor layer create tensile strain in the underlying active layer. As an example, for a silicon active layer, the sacrificial stressor layer may be silicon germanium. Typically the strain transferred to the active layer is maintained by filling the trenches with an appropriately stiff material such as silicon oxide, silicon nitride or a combination of those insulators before removing the sacrificial stressor layer.

This discussion now illustrates a preferred process that uses both a buried and a sacrificial stressor layer to create a strained semiconductor active layer. FIG. 1 illustrates results of a preferred process for forming a buried stressor layer that first deposits a blanket silicon germanium layer on a silicon substrate 10 by standard epitaxial techniques so that the silicon germanium layer 12 has a thickness of a predetermined level or smaller. When deposited in this manner, the formed silicon germanium layer 12 adopts the in-plane lattice spacing of the silicon substrate 10. An exemplary predetermined thickness for the silicon germanium layer 12 might be a fraction, such as 20% to 80%, of the critical thickness for an independent silicon germanium layer with the selected germanium concentration. The critical thickness is that thickness at which it becomes thermodynamically favorable for a silicon germanium layer deposited on a silicon substrate to relax by generating dislocations. The resulting silicon germanium layer 12 is under compressive strain so long as its thickness does not exceed the critical thickness. Because the silicon germanium layer 12 is not relaxed in this as-deposited state, it is essentially dislocation-free. A preferred process continues by forming a thin layer of epitaxial silicon 14 to a thickness, for example, of between about 4 nm to 20 nm over the compressively strained, un-relaxed silicon germanium layer 12. The active silicon layer 14 is unstrained as formed because the in-plane lattice spacing of the un-relaxed silicon germanium layer 12 is the same as that of the underlying silicon substrate 10.

Figure 2:
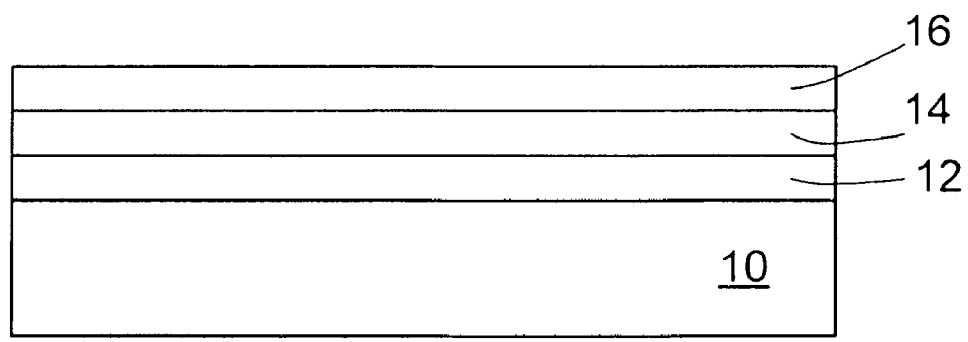

One type of preferred process continues by depositing a sacrificial stressor layer 16 on the silicon active layer 14 as shown in FIG. 2. A preferred sacrificial stressor layer 16 is silicon germanium having a second predetermined thickness that is preferably a fraction of the critical thickness for silicon germanium having that germanium concentration. For the described deposition process using silicon germanium buried and sacrificial layers, the sacrificial silicon germanium layer 16 will interact with the buried silicon germanium layer 12 if the silicon active layer 14 is sufficiently thin. In typical implementations in which an effective level of strain is introduced into the active silicon layer 14, the silicon active layer 14 is expected to be sufficiently thin that the buried and sacrificial silicon germanium layers will interact. One effect of this interaction is that it becomes thermodynamically favorable for the sacrificial silicon germanium layer 16 to relax by generating dislocations when the combined thickness of the buried and sacrificial silicon germanium layers 12, 16 exceeds the critical thickness for a single, uninterrupted silicon germanium layer. It is consequently preferable that the combined thickness of the buried and the sacrificial silicon germanium layers 12, 16 be less than the critical thickness. Generally it is preferred that the total thickness be near the critical thickness to maximize the strain in the active layer. Because the buried and sacrificial silicon germanium layers 12, 16 can have different germanium concentrations and thicknesses, and because the intermediate active layer might alter the thermodynamics for forming dislocations in the sacrificial layer, it is generally preferred to determine the desired combined critical thickness through simulations. It is of course possible to determine the combined critical thickness empirically.

As deposited, the buried germanium stressor layer 12 adopts the in-plane lattice spacing of the bulk silicon substrate 10. The buried silicon germanium stressor layer 12 is compressively stressed in-plane as formed because it has an equilibrium in-plane lattice spacing that is larger than that of the bulk silicon lattice spacing of the preferred substrate 10. The silicon active layer 14 is deposited in an unstrained state because the silicon germanium layer 12 on which it is deposited has the in-plane lattice spacing of bulk silicon. If a silicon germanium sacrificial stressor layer 16 is deposited on the active silicon layer 14 at this point, the as-deposited silicon germanium sacrificial stressor layer 16 will be compressively strained in-plane as it is deposited because the active silicon layer 14 will have the in-plane lattice spacing of bulk silicon and the relaxed lattice spacing of the silicon germanium sacrificial stressor layer 16 is greater than that of the active silicon layer 14.

Subsequent processing relaxes both the buried and sacrificial stressor layers 12, 16 elastically and then removes the sacrificial stressor layer 16. Preferred processes elastically relax the buried and sacrificial stressor layers through edge relaxation in a manner that effectively transfers the stress from the sacrificial stressor layer 16 and the buried stressor layer 12 to the active silicon layer 14. Because the in-plane lattice spacing of the sacrificial and buried stressor layers 12, 16 in this illustration will increase, the edge relaxation process induces tensile strain in the active silicon layer 14. Other combinations of materials, such as using silicon as stressor layers and silicon germanium as an active layer and substrate, can produce a compressively strained active semiconductor layer.

Figure 3:
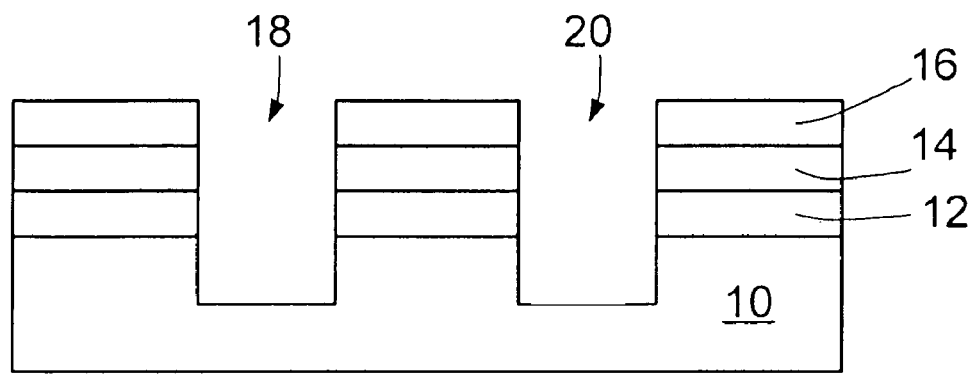

Preferred implementations relax at least a portion of the sacrificial silicon germanium stressor layer 16 and at least a portion of the buried silicon germanium stressor layer 12 by etching trenches separated by an appropriate interval through the sacrificial silicon germanium stressor layer 16, through the active silicon layer 14, through the buried silicon germanium layer 12 and into the substrate 10. As soon as the trenches are cut, and without further treatment, the compressive strain in the buried and sacrificial silicon germanium layers partially relaxes, most advantageously in an elastic process, which induces tensile strain in the active silicon layer 14. Illustrative trenches 18, 20 are shown in FIG. 3. The process can etch the trenches according to the techniques currently used to form "shallow trench isolation" (STI) trenches. Preferably, then, the process accomplishes edge relaxation while forming trench isolation so that preferred trenches define device active regions, including channels of MOSFETs, in the active silicon layer at the same time that the process relaxes the sacrificial and buried stressor layers. Most preferably, the trenches are positioned so that the active regions have a lateral extent that is sufficiently small that relaxation can occur across the entire lateral extent of the buried and sacrificial silicon germanium layers 12, 16 between the trenches. Additionally, the process preferably etches trenches to a sufficient depth into the substrate to allow the buried silicon germanium layer to relax desirably. U.S. Pat. No. 7,338,834, which is incorporated by reference above, further discusses the conditions and mechanisms involved in edge relaxation.

The FIG. 3 illustration is schematic and shows only a small fraction of the typical workpiece, which might be a 300 mm wafer or other commercially appropriate wafer format. Thicknesses of layers, the substrate and dimensions of all features shown in the drawings are not to scale. Those of ordinary skill in the art will appreciate that in many modern configurations, active device regions will be surrounded by a continuous set of interconnected trenches. Even though such a set of interconnected trenches can be viewed as a single trench, for clarity, the present discussion refers to the etched openings on opposite sides of an active region as different trenches. Some preferred embodiments of the invention use SOI substrates having buried insulator layers and etch trenches to the depth of or through the buried insulator layer. Etching trenches to such a depth is particularly preferred because it allows more complete relaxation and more complete stress transfer.

Following etching of the trenches 18, 20 that relax the illustrative stressor layers 12, 16 and transfer strain to the active layer 14, the process preferably fills the trenches 18, 20 to maintain the strain in the active layer 14. Most preferably the trenches are filled with a comparatively stiff one or more insulating materials to sustain the strain in the active layer 14 before the sacrificial stressor layer 16 is removed. Trench fill materials might include silicon oxide and silicon nitride. In this regard, silicon nitride is a particularly stiff insulating material and may provide advantages for maintaining strain in the active layer 14. For the illustrated implementations, the trench fill material preferably is selected to be sufficiently non-compliant such that at least a desired amount of tensile strain remains in the surface of the active silicon layer 14 after the sacrificial silicon germanium stressor layer 16 is removed. Typical processes remove excess trench fill material using chemical mechanical polishing. After the trenches are filled and excess fill material is removed, the process preferably removes the sacrificial stressor layer 16. Selective wet and dry etches are known for the preferential removal of the silicon germanium stressor layer 16, leaving the silicon layer 14 underneath unetched and undamaged. As an example, a mixture of hydrofluoric acid (HF), hydrogen peroxide ($H_2O_2$), and acetic acid ($CH_3COOH$) can selectively etch silicon germanium layers from a silicon surface of a substrate at selectivities of 300:1 or more.

Figure 4:
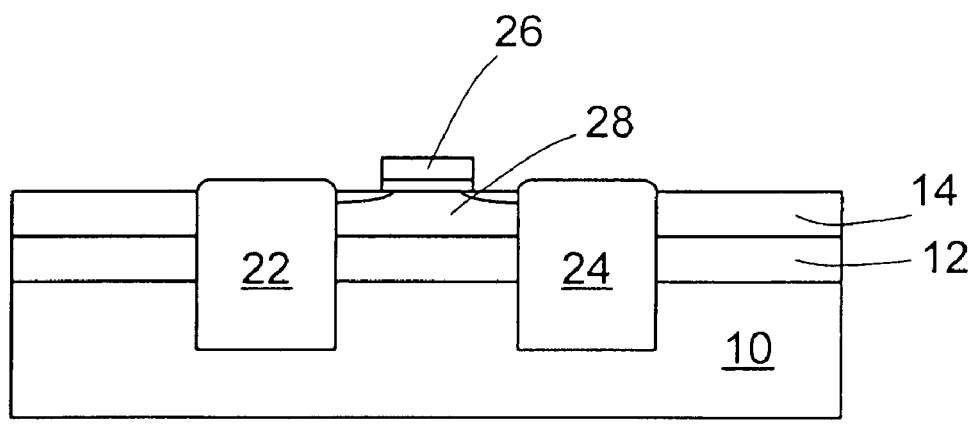

Further processing is performed, such as additional chemical mechanical polishing or wet etching of the remaining trench fill material to provide trench isolation structures 22, 24 like those shown in FIG. 4. The processing preferably maintains strain within the active layer 14 and leaves isolation structures 22, 24 appropriate to further processing. For example, the surfaces of the isolation structures 22, 24 are preferably at a level with respect to the substrate to allow further processing. Desirable further processing may include forming n-channel MOS field effect transistors 26 in tensile strained p-type active regions 28. Other desirable processing may additionally include forming p-channel MOS FETs in n-type active regions, which may be similarly or differently strained in comparison to the illustrated p-type active regions 28. CMOS circuits having n-channel and p-channel MOS FETs may be formed with desired strain engineering for both of the n-channel and p-channel MOS FETs of the CMOS circuits.

The present inventors have investigated the strain that can be applied to an active region using processes as illustrated in FIGS. 1-4. Simulations were performed assuming a width for trenches 18, 20 of one hundred nanometers, an active region width of one hundred nanometers and silicon oxide as the material used to fill the trenches to form the isolation structures 22, 24. One set of simulations using these exemplary parameters considered only the effect of a silicon germanium sacrificial stressor layer without the presence of a buried stressor layer. These simulations indicated a maximum strain of 310 MPa at a depth of one nanometer at the center of the active region. Another set of simulations considered only the effect of a buried silicon germanium stressor layer without a sacrificial stressor layer. These simulations indicated a maximum strain of 330 MPa at a depth of one nanometer at the center of the active layer. Both of these illustrations used a stressor layer, whether sacrificial or buried, having the critical thickness for the optimum germanium concentration.

Simulations were also performed on the preferred process, again using the above-referenced dimensions and materials, that forms buried and sacrificial stressor silicon germanium layers and transfers stress from both the buried and sacrificial layers to the silicon active layer. Optimizations were performed to determine the thickness of the buried layer and the thickness of the sacrificial layer subject to the constraint that the total thickness of the two stressor layers is equal to the critical thickness of the silicon germanium layer. These simulations showed that a process forming both a buried stressor layer and a sacrificial stressor layer produces a maximum strain of 460 MPa at a depth of one nanometer at the center of the active layer. Thus, the combination of the buried and sacrificial stressor layers produce a remarkably higher level of maximum strain as compared to processes that use only a critical thickness buried stressor layer or only a critical thickness sacrificial stressor layer.

Figure 5:
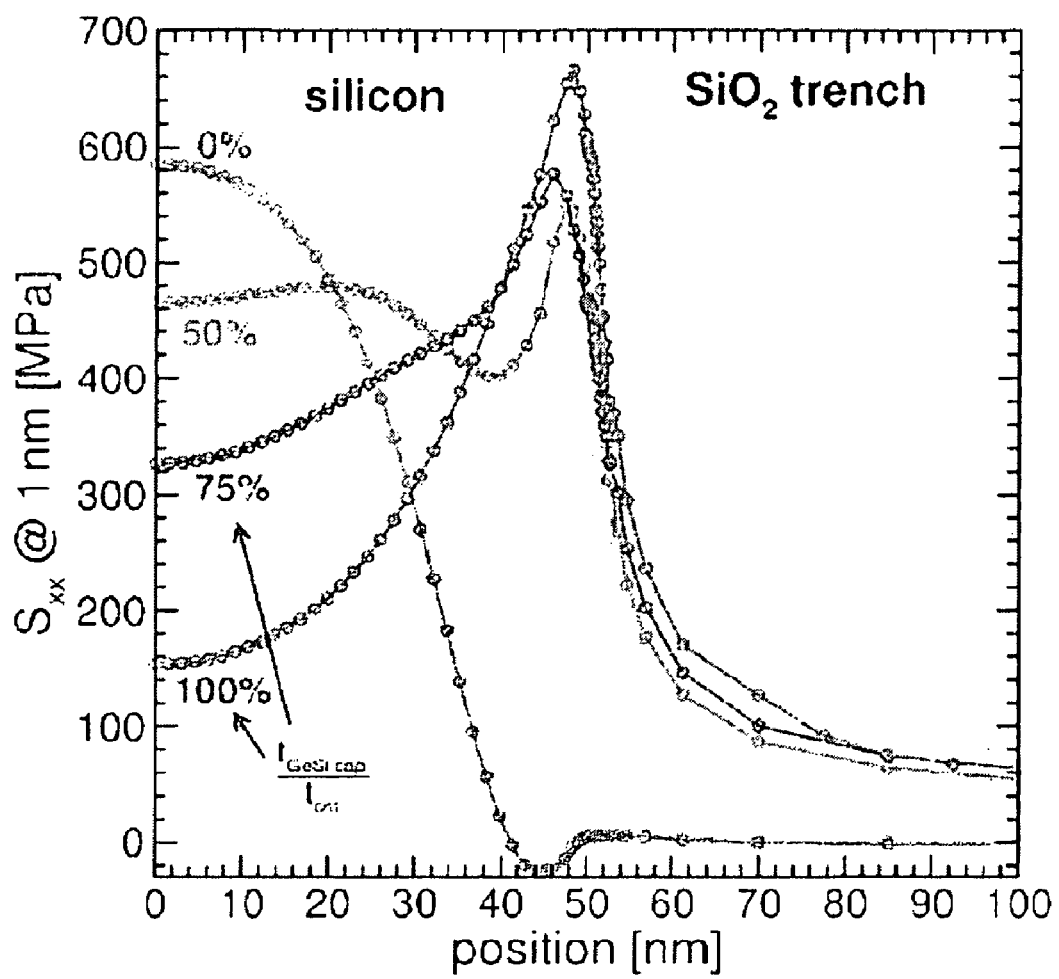
FIG. 5 illustrates the strain distribution transferred to an active layer from a combination of a buried stressor layer and a sacrificial stressor layer for different proportions of the total thickness constraint allocated to the buried and sacrificial stressor layers.

In addition to the greater maximum strain created in the active layer according to the process of FIGS. 1-4, the process also produces a more uniform strain distribution across the width of the active region. This is because the sacrificial stressor and the buried stressor layers tend to have different strain distributions across the width of the active layer. This is illustrated in FIG. 5, which shows the results of simulations for a number of different thickness allocations within the constraint that the total thicknesses of the buried and sacrificial stressor layers are equal to the critical thickness. The five curves in the graph include 100% of the constraint allocated to the sacrificial stressor layer, which corresponds to the use of no buried stressor layer and 0% of the constraint allocated to the sacrificial stressor layer (no sacrificial stressor layer, the buried stressor layer having a thickness equal to the critical thickness). Three intermediate thickness combinations are shown. All of the illustrations are for a silicon germanium buried stressor layer having 20% germanium and a silicon germanium sacrificial stressor layer having 15% germanium. The active region has a lateral dimension of one hundred nanometers, the trench is one hundred nanometer wide and the strain is illustrated at a depth of one nanometer. Note that the dimensions listed here are only illustrative and are not limiting. This is also true of the constraint on total thickness. The total thickness need not be set to the critical thickness.

FIG. 5 shows that the sacrificial stressor layer (illustrated by the 100% thickness allocation line) creates comparatively greater stress at the interface between the active region and the trench. The buried stressor layer (illustrated by the 0% allocation line) applies comparatively greater stress near the center of the active region. Allocating 50% or 75% of the thickness constraint to the sacrificial stressor layer provides a greater level of uniformity of strain across the active region.

Note here that the various layers are described as having a nominally uniform composition as a function of the thickness within, for example, silicon germanium, layers. This is not intended to be limiting. Effective stressor and active layers can have compositional variations as a function of depth within the layer.

In an alternate implementation that may have important advantages in manufacturing, the sacrificial stressor layer (16 in FIG. 2) may be formed of stressed silicon nitride. A thin film of silicon nitride may be deposited, for example by plasma enhanced chemical vapor deposition (PECVD), in a condition of either tensile or compressive stress as deposited. For example, Applied Materials reports that its Producer Celera system for plasma-enhanced CVD (PECVD) offers an integrated stress silicon nitride deposition and UV cure solution which delivers tensile stress of up to 1.7 GPa, with extendibility to 2.0 GPa, while meeting low thermal budget requirements. The same deposition chamber can deposit silicon nitride films with compressive stresses up to 3.5 GPa. By varying input factors in the PECVD process, predictable amounts of either tensile or compressive built-in stress in the range 1.7 GPa tensile to 3.0 GPa compressive can be selectively incorporated in a deposited silicon nitride thin film. Silicon nitride may be preferred over epitaxial silicon germanium as a sacrificial stressor material for several reasons. Deposition of silicon nitride by PECVD is in general a lower cost process than growth of epitaxial silicon germanium on silicon. Stressed silicon nitride may be applied conveniently as a sacrificial stressor on a wide range of semiconductor substrates other than silicon including germanium, group III-V and group II-VI compound semiconductors. Silicon nitride can be deposited in a state of either tensile or compressive stress which allows a process to induce either compressive or tensile strain in the underlying semiconductor, respectively. In addition to serving the role of sacrificial stressor, the silicon nitride can be used as a hard mask for patterning trenches by plasma etch processes. The silicon nitride may also be used conveniently as the polish stop layer when planarizing the trench fill material by chemical mechanical polishing.

Whatever material is selected for the sacrificial stressor layer, preferred processes can select and independently control the relative amounts of stress directed along each of the primary axes of a semiconductor device, for example, corresponding to the width axis and length axis of a MOSFET. The amount of stress directed along different axes may be controlled independently through the spacing of the isolation trenches determined by the layout of the mask used to define the active area of the devices. Where in-plane stress is not desired in the semiconductor along a particular axis in a semiconductor device, the trenches preferably are spaced sufficiently far apart along that axis such that the effect of the edge relaxation mechanism is suitably minimized. Conversely, where in-plane stress is desired in the semiconductor along a particular axis in a semiconductor surface portion, the trenches preferably are spaced sufficiently close together along that axis so the effect of the edge relaxation mechanism is suitably maximized. The isolation trenches subsequently are filled with a suitable insulator using any of the shallow trench isolation (STI) fill processes already well established in the CMOS IC industry or that may be introduced in the future. Preferably the trench fill is performed to maintain the desired stress properties of adjacent active regions.

Figure 6:
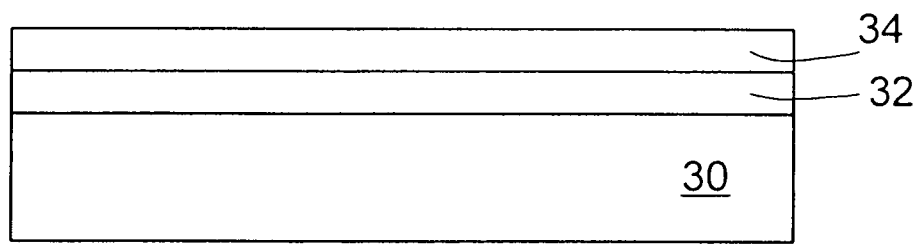
FIGS. 6-11 illustrate process steps according to other aspects of the present invention for forming a strained semiconductor active region.

FIGS. 6-11 illustrate another aspect of the invention in which preferred processes at least partially relax the buried stressor layer prior to depositing the sacrificial stressor layer so that the sacrificial stressor layer is deposited on the modified in plane lattice spacing of a strained (tensile or compressive) semiconductor surface layer. Referring to FIG. 6, a preferred process prepares a substrate 30, deposits a buried stressor layer 32 and forms an eventual active layer 34 over the buried stressor layer 32. Substrate 30 can be selected to be silicon, the stressor layer 32 can be selected to be silicon germanium and the active layer 34 can be selected to be silicon. As with the above discussed implementation, FIG. 6 preferably forms a compressively stressed silicon germanium layer 32, since the equilibrium in-plane lattice constant of silicon germanium is larger than that of the silicon substrate 30. The as-deposited silicon active layer 34 is relaxed, since the silicon germanium buried stressor layer 32 exhibits the in-plane lattice constant of the underlying silicon substrate 30. Some preferred implementations then at least partially relax the buried stressor layer 32 prior to forming a sacrificial stressor layer over the remaining portions of the active layer 34. This illustrative embodiment then fills the trenches with a material that may, in some cases, be favorable for the selective deposition of a sacrificial stressor material. For example, silicon oxide may be preferred as a trench fill material so that silicon germanium can be selectively deposited on the remaining portions of the active silicon layer and not deposited on the surface of the silicon oxide layer over the trench regions.

Figure 7:
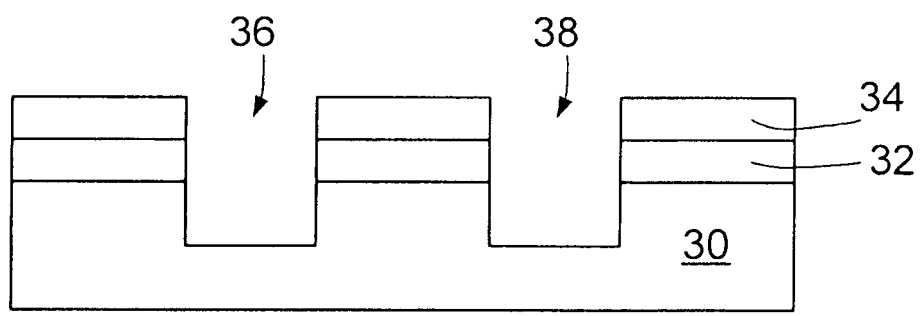
Figure 8:
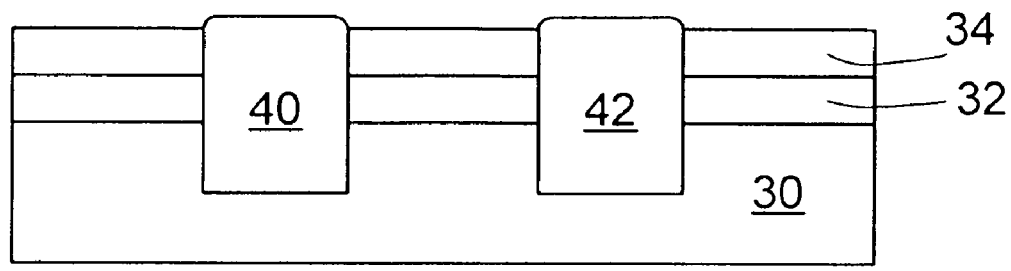
Figure 9:
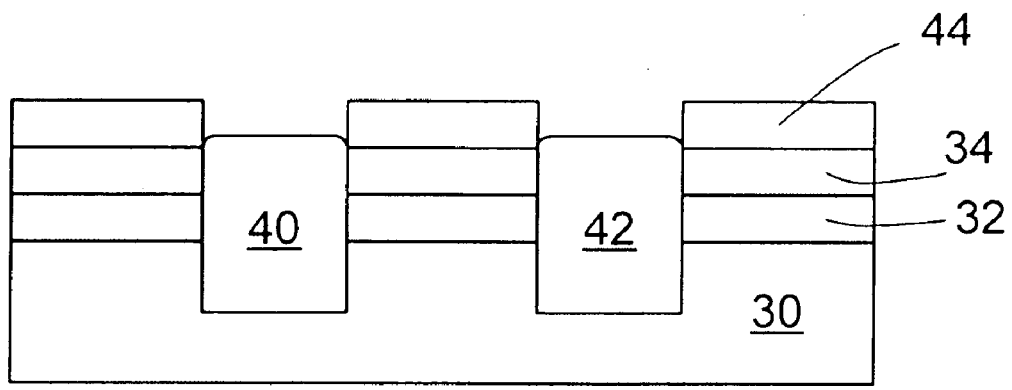
Figure 10:
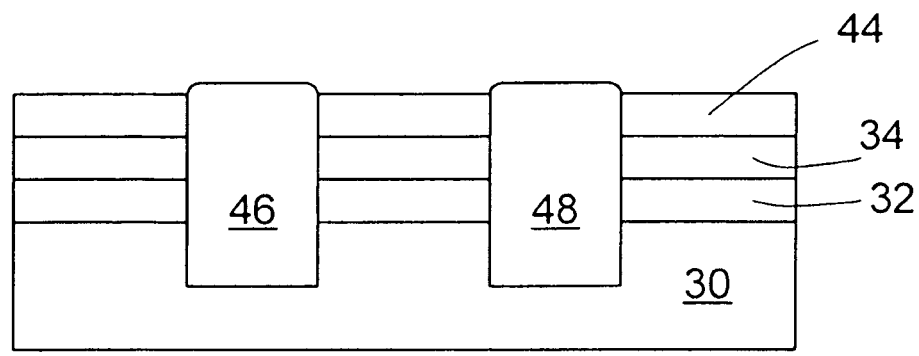
Figure 11:
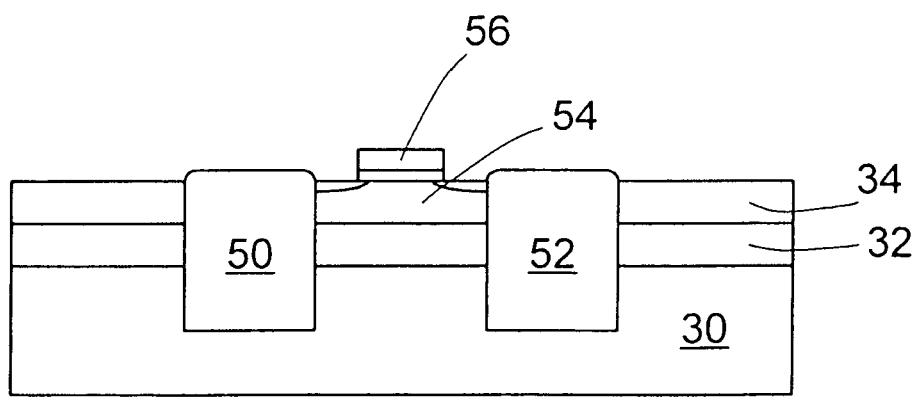

This process continues from FIG. 6 by forming trenches 36, 38 to effect at least partial edge relaxation of the silicon germanium buried stressor layer 32, creating strain in the active layer 34, as shown in FIG. 7. This implementation preferably forms trenches 36, 38 according to the conventional trench isolation strategies used for bulk or SOI substrates, as appropriate to the substrate being used. Most preferably, the trenches are separated by desired widths of active regions and the trenches are of a depth to allow for appropriate edge relaxation, preferably extending across active regions of interest. These conditions and edge relaxation are described in U.S. Pat. No. 7,338,834, which is incorporated by reference. After opening the trenches 36, 38, this implementation preferably fills the trenches with a temporary fill material, for example silicon oxide deposited from a TEOS source (tetra-ethyl-ortho-silicate, a well known precursor for deposition of silicon dioxide films). Removal of excess deposited material may be accomplished by chemical mechanical polishing (CMP) or etching or by combinations of these processes or other known strategies. The resulting filled trenches 40, 42 have an upper surface that is approximately at the surface of the active layer 34.

Another example of a material that may be used to, at least in part, fill the trenches is silicon oxide (specifically, $SiO_2$) with a relatively high, for example 1-3%, concentration of impurities, for example boron, phosphorus or both boron and phosphorus. This material is often known as borophosphosilicate glass or BPSG. The boron or phosphorus impurities may allow the BPSG to undergo viscous flow at a relatively low temperature, for example 850° C. By heating the BPSG material to a temperature at which viscous flow occurs, the material becomes relatively more fluid, allowing stress-relieving deformation. When the BPSG is later cooled, the BPSG may become more solid, inhibiting further relaxation of stress.

This implementation continues by removing any excess fill material so that the remaining surface of the fill material 40, 42 is approximately planar with the tops of the exposed active semiconductor regions 34. Desirably, the surface of the filled trenches 40, 42 is silicon oxide that is compatible with a selective deposition process. Then the implementation selectively deposits the sacrificial stressor layer on the active semiconductor surfaces 34 exposed after trenching, fill material deposition and removal excess material. Preferably this alternate process deposits the sacrificial stressor layer 44 preferentially so that it is only formed on the exposed surfaces of the active semiconductor 34. For example, appropriate selective deposition techniques are known in the art to deposit silicon germanium on exposed silicon surfaces, when those materials are selected. Appropriate selective deposition techniques are known for other substrates and sacrificial layers as well.

For the preferred silicon germanium sacrificial stressor layer 44 and the preferred silicon active layer 34, the silicon germanium sacrificial stressor layer 44 is compressively stressed as it is deposited. Assuming that the buried stressor layer and the sacrificial stressor layer interact, the total thickness of the buried and sacrificial stressor layers is preferably constrained to the critical thickness. Because of the selective deposition process, there will be some tendency for the sacrificial stressor layer 44 to transfer strain to the underlying active layer 34 as the stressor layer 44 is deposited. Trench fill material such as oxide deposited from a TEOS source is somewhat compliant, which allows some level of edge relaxation at the trench sidewalls to partially relax the sacrificial stressor film close to the trenches and induce strain in the active semiconductor layers on which MOSFETs or other devices will be constructed. After this, the process would densify the trench fill material so that it will hold the induced stress in the semiconductor layer when the sacrificial stressor layer is removed.

Generally, though, the trench fill material 40, 42 may prevent full transfer of strain to the silicon active layer 34. Consequently, at least some implementations of the process remove the temporary fill materials 40, 42 following deposition of the sacrificial stressor layer 44 to allow for more complete transfer of the strain from the stressor layer 44 to the active layer 34. When the temporary fill materials 40, 42 are removed, the sacrificial stressor layer 44 transfers strain to the active silicon layer 34. The trenches are then filled by forming one or more layers of silicon oxide and/or silicon nitride followed by planarization to define filled trenches 46, 48. Further processing is performed, as described above, to remove the sacrificial stressor layer, to further planarize the trench isolation structures 50, 52. Materials for filling the trenches are preferably selected to maintain the strain in the surface layer 54 created by the sacrificial stressor layer. Processing continues to form MOS field effect transistors 56 or other devices with channels or active regions formed in the strained semiconductor surface region 54.

In a variation on the process illustrated in FIGS. 6-11, a process may provide a substrate, form trenches in the substrate and fill the trenches with a material such as silicon oxide on which silicon germanium tends not to deposit in a selective deposition process. This process then forms a buried stressor layer over those portions of the substrate other than those regions where trenches are formed, and then the process forms an active layer over this buried stressor layer. Next this process forms a sacrificial stressor layer over the active layer, where the sacrificial layer is in a stressed state in comparison to its equilibrium state. This process continues by filling the trenches with a material that can be altered from a relatively fluid or compliant state to a relatively solid or stiff state so that strain is retained in the active layer when the material is caused to be in its relatively stiff state. The process removes the sacrificial stressor layer.

The distribution of strain in the various layers following trench formation is inhomogeneous and the final strain distribution is strongly dependent on the geometry of the layered structures, the separation of opposing trenches, and the depth and widths of the trenches. Another consideration is the different impact that the in-plane stress components have on carrier mobilities. For electrons (in n-MOSFETs) it is generally understood that tensile strain is desirable along both the length and width axes of n-MOSFETs that are aligned along <110> axes of a {100} oriented substrate. That is, for n-MOS- FETs, the piezoelectric coefficients are such that mobility increases with biaxial tensile strain. However, for holes, tensile strain is only desirable along the width axis for a similarly oriented p-MOSFET and uniaxial compressive strain is desirable along the length axis in such a p-MOSFET. This has led to the use of selectively grown silicon-germanium (SiGe) inserts in the source and drain regions of p-MOSFETs to induce the desired uniaxial compressive strain in the silicon channel region.

Alternative implementations of the present invention can provide uniaxial compressive stress in the top silicon layer directed along the length of the channel in a p-MOSFET while still obtaining a tensile strain in the width direction of the p-MOSFET channel. Preferred implementations may beneficially use the technique of applying compressive stress in the p-channel by growing layers of epitaxial silicon germanium selectively in recesses in the source and drain regions of the p-MOSFET. Since stresses are superimposed linearly, the net effect of this action is the same as in conventional compressed silicon germanium source/drain implementations. Thus selective silicon germanium source and drain insert technology may be applied efficiently in implementations of the present invention to induce a uniaxial compressive stress along the length of a p-MOSFET in much the same way as silicon germanium source and drain stressors are applied in bulk silicon CMOS technology.

Alternately, where in-plane stress is not desired in the semiconductor along a particular axis in a semiconductor device, the trenches along that axis may be etched and filled after the removal of the sacrificial stressor layer, while trenches along a particular axis for which stress is desired may be etched and filled prior to the removal of the sacrificial stressor layer.

Other preferred implementations may use germanium-on-insulator as the semiconductor and an epitaxial silicon germanium alloy as the preferred buried and sacrificial stressor layers. In these preferred implementations, the stressor layer preferably has a germanium fraction in the range 0% to 80% and a thickness of less than or equal to a critical thickness for generation of dislocations. The silicon germanium stressor layer is under tensile stress and in-plane compressive strain is induced in the germanium active layer. Preferably, the trenches are etched to a depth sufficient to penetrate the buried insulator layer. The trench fill material is selected to be sufficiently non-compliant such that some amount of tensile strain remains in the germanium active layer after the sacrificial silicon germanium stressor layer is removed. Preferably known selective wet or dry etches or other wet or dry etches are used to remove the silicon germanium stressor layer, leaving the germanium layer underneath unetched and undamaged.

For a number of embodiments of the present invention, the stressor and active regions can generally be silicon germanium $Si_{1-x}Ge_x$, with the stressor layers able to apply either compressive or tensile stress to the active regions. To create the level of desired tensile or compressive strain in the active regions, the stressor layers preferably will have an "x" value in the above chemical formula of at least about 0.1 greater or smaller than the "x" value of the active regions. As discussed, the "x" value of the buried and sacrificial stressors need not be the same. In the deposition process described above, the buried and sacrificial stressor layers would be silicon germanium with a germanium component "x" at least about 0.1 larger than the active layer. Similarly, the active layer and substrate for a silicon germanium system will generally also have the composition $Si_{1-x}Ge_x$, with the active layer and the substrate typically having similar compositions with an "x" value of less than about 0.1. This example is provided in the context of the silicon germanium system. Other systems can be used and will have different but corresponding levels of compositional differences to achieve target tensile or compressive strains in active regions.

The present invention has been described in terms of certain preferred embodiments. Those of ordinary skill in the art will appreciate that various modifications and alterations could be made to the specific preferred embodiments described here without varying from the teachings of the present invention. Consequently, the present invention is not intended to be limited to the specific preferred embodiments described here but instead the present invention is to be defined by the appended claims.

We claim:

1. A method of manufacturing a semiconductor device, comprising:
   providing a substrate, forming a buried stressor layer over the substrate and forming an active layer over the buried stressor layer, the buried stressor layer between the substrate and the active layer, the buried stressor layer formed in a stressed state in comparison to the substrate when the buried stressor layer is formed, the buried stressor layer having a stressed surface adjacent the active layer when the active layer is formed;
   forming a sacrificial stressor layer over the active layer, the sacrificial stressor layer formed in a stressed state in comparison to the active layer when the sacrificial stressor layer is formed; and
   etching trenches through the active layer, through the buried stressor layer and into at least a portion of the substrate so that the etching trenches stresses at least a portion of the active layer and relaxes stress in at least portions of the buried stressor layer.

2. The method of claim 1, further comprising filling the trenches to maintain at least a portion of the stress within the stressed portion of the active layer; and
   removing remaining portions of the sacrificial stressor layer after the filling.

3. The method of claim 1, wherein the sacrificial stressor layer is silicon germanium.

4. The method of claim 1, wherein the sacrificial stressor layer is silicon nitride having a built-in compressive stress as-deposited.

5. The method of claim 1, wherein the sacrificial stressor layer is silicon nitride having a built-in tensile stress as-deposited.

6. The method of claim 1, further comprising etching trenches through the sacrificial stressor layer prior to the etching trenches through the active layer.

7. The method of claim 1, wherein forming the sacrificial stressor layer comprises selectively depositing the sacrificial stressor layer on portions of the active layer remaining following etching trenches through the active layer.

8. The method of claim 7, further comprising:
   filling the trenches to maintain at least a portion of strain transferred from the sacrificial stressor layer to the active region; and
   removing remaining portions of the sacrificial stressor layer after the filling.

9. The method of claim 7, further comprising:
   temporarily filling the trenches with temporary fill material prior to selectively depositing the sacrificial stressor layer;
   removing the temporary fill material following the selectively depositing;

filling the trenches to maintain at least a portion of strain transferred from the sacrificial stressor layer to the active region; and removing remaining portions of the sacrificial stressor layer after the filling.

10. The method of claim 9, wherein the sacrificial stressor layer is silicon germanium.

11. The method of claim 9, wherein the sacrificial stressor layer is deposited in a state of compressive stress and wherein the active region has tensile strain after the removing.

12. The method of claim 11, wherein the sacrificial stressor layer is silicon germanium.

13. The method of claim 11, wherein the sacrificial stressor layer is silicon nitride deposited in a state of compressive stress.

14. The method of claim 9, wherein the temporary fill material is deposited from a TEOS source.

15. A method of manufacturing a semiconductor device, comprising:

providing a substrate, forming a buried stressor layer over the substrate and forming an active layer over the buried stressor layer, the buried stressor layer between the substrate and the active layer, the buried stressor layer formed in a stressed state in comparison to the active layer when the active layer is formed, the buried stressor layer having a stressed surface adjacent the active layer when the active layer is formed;

forming a sacrificial stressor layer over the active layer, the sacrificial stressor layer formed in a stressed state in comparison to the active layer when the sacrificial stressor layer is formed;

etching trenches through the sacrificial stressor layer, the active layer and through the buried stressor layer so that the etching trenches stresses at least a portion of the active layer and relaxes stress in at least portions of the buried stressor layer and the sacrificial stressor layer; and filling the trenches to maintain at least a portion of transferred stress within the portions of the active layer.

16. The method of claim 15, wherein the sacrificial stressor layer is silicon germanium, the active layer is silicon, the buried stressor layer is silicon germanium, the substrate is silicon and the etching forms trenches extending through the buried stressor layer and at least partially into the substrate.

17. The method of claim 15, wherein the sacrificial stressor layer is silicon nitride having a built-in compressive stress as-deposited.

18. The method of claim 15, wherein the sacrificial stressor layer is silicon nitride having a built-in tensile stress as-deposited.

19. The method of claim 15, wherein the sacrificial stressor layer is silicon germanium having a compressive stress as-deposited.

* * * * *